United States Patent
Stokes

(10) Patent No.: US 8,929,034 B2
(45) Date of Patent: Jan. 6, 2015

(54) DEVICES AND METHODS USING RECESSED ELECTRON SPIN ANALYZERS

(71) Applicant: Seagate Technology LLC, Cupertino, CA (US)

(72) Inventor: Scott Stokes, Maple Grove, MN (US)

(73) Assignee: Seagate Technology LLC, Cupertino, CA (US)

( * ) Notice: Subject to any disclaimer, the term of this patent is extended or adjusted under 35 U.S.C. 154(b) by 0 days.

(21) Appl. No.: 14/132,273

(22) Filed: Dec. 18, 2013

(65) Prior Publication Data

US 2014/0104726 A1    Apr. 17, 2014

Related U.S. Application Data

(62) Division of application No. 13/332,876, filed on Dec. 21, 2011, now Pat. No. 8,619,393.

(60) Provisional application No. 61/524,024, filed on Aug. 16, 2011.

(51) Int. Cl.
| | | |
|---|---|---|
| G11B 5/39 | (2006.01) | |
| G11B 5/11 | (2006.01) | |
| G01R 33/09 | (2006.01) | |
| G11B 5/127 | (2006.01) | |

(52) U.S. Cl.
CPC .............. *G11B 5/11* (2013.01); *G01R 33/093* (2013.01); *G11B 5/3909* (2013.01); *G11B 5/1278* (2013.01); *G11B 2005/3996* (2013.01)
USPC ...................... 360/324; 360/319; 360/324.12

(58) Field of Classification Search
USPC ................................ 360/324–324.2, 319, 321
See application file for complete search history.

(56) References Cited

U.S. PATENT DOCUMENTS

| | | | |
|---|---|---|---|
| 8,320,080 B1 * | 11/2012 | Braganca et al. | 360/128 |
| 8,675,309 B2 * | 3/2014 | Braganca et al. | 360/125.3 |
| 2007/0230066 A1 | 10/2007 | Gill | |
| 2009/0154030 A1 | 6/2009 | Yamada | |
| 2009/0310263 A1 | 12/2009 | Sasaki | |
| 2013/0009712 A1 * | 1/2013 | Braganca et al. | 331/94.1 |

FOREIGN PATENT DOCUMENTS

WO    2011004891    1/2011

OTHER PUBLICATIONS

Hamrle et. al,, Current distribution inside Py/Cu lateral spin-valve devices, Physical Review, Mar. 4, 2005.
Kimura et. al, Switching magnetization of a nanoscale ferromagnetic particle using nonlocal spin injection, Physical Review Letters, Jan. 23, 2006, vol. 96.

* cited by examiner

*Primary Examiner* — Will J Klimowicz
(74) *Attorney, Agent, or Firm* — Braden Katterheinrich

(57) ABSTRACT

In certain embodiments, an apparatus includes a top shield, bottom shield, polarizer, nonmagnetic conductor layer, and a sensor stack having a first sensor layer. The sensor stack is positioned at a distance recessed from a first plane. The nonmagnetic conductor layer is positioned between the polarizer and the first sensor layer. A magnetization of the first sensor layer is arranged and configured to move in the same direction as a magnetization of the polarizer.

12 Claims, 4 Drawing Sheets

DEVICES AND METHODS USING RECESSED ELECTRON SPIN ANALYZERS

RELATED APPLICATIONS

The present application is a divisional application claiming the benefit under 35 U.S.C. §121 from U.S. application Ser. No. 13/332,876, filed on Dec. 21, 2011, the contents of which are incorporated by reference herein in its entirety, which application is an application claiming the benefit under 35 §119(e) from U.S. provisional application Ser. No. 61/524,024 filed on Aug. 16, 2011, entitled "Devices and Methods Using Recessed Electron Spin Analysers," the contents of which are incorporated by reference herein in its entirety.

SUMMARY

Certain embodiments of the present invention are generally directed to devices that include recessed electron spin analyzers.

In certain embodiments, an apparatus includes a top shield, bottom shield, polarizer, nonmagnetic conductor layer, and a sensor stack having a first sensor layer. The sensor stack is positioned at a distance recessed from a first plane. The nonmagnetic conductor layer is positioned between the polarizer and the first sensor layer. A magnetization of the first sensor layer is arranged and configured to move in the same direction as a magnetization of the polarizer.

DETAILED DESCRIPTION

The present disclosure relates to sensors and/or sensor stacks used, for example, in magnetic recording heads.

Data storage devices, such as hard disk drives, can be provisioned with a magnetic recording head and a rotatable medium to which data are stored. As track density increases, the size of read sensors used in magnetic heads is reduced because the bit size of the media being read is reduced. For example, at 1 Tb/in$^2$ and a bit aspect ratio of 4, the bit size in the media is about 12.5 nm by 50 nm. As a result of reduced bit sizes, a signal pulse width should be reduced.

One contributor to pulse width is shield-to-shield spacing of the read sensor. Reducing the shield-to-shield spacing of a read sensor may lower the signal pulse width. Present reader designs including tunneling magnetoresistive (TMR) sensors typically have a shield-to-shield spacing greater than 20 nm to fit all layers between the shields (cap, seed, free layer, barrier layer, anti-ferromagnetic layer, and reference layer). Another reader design includes trilayer readers, which typically have a shield-to-shield spacing greater than 10 nm to fit all the layers (cap, seed, two free layers, and barrier layer). Accordingly, certain embodiments of the present disclosure include a read sensor with further reduced shield-to-shield spacing.

Figure 1:
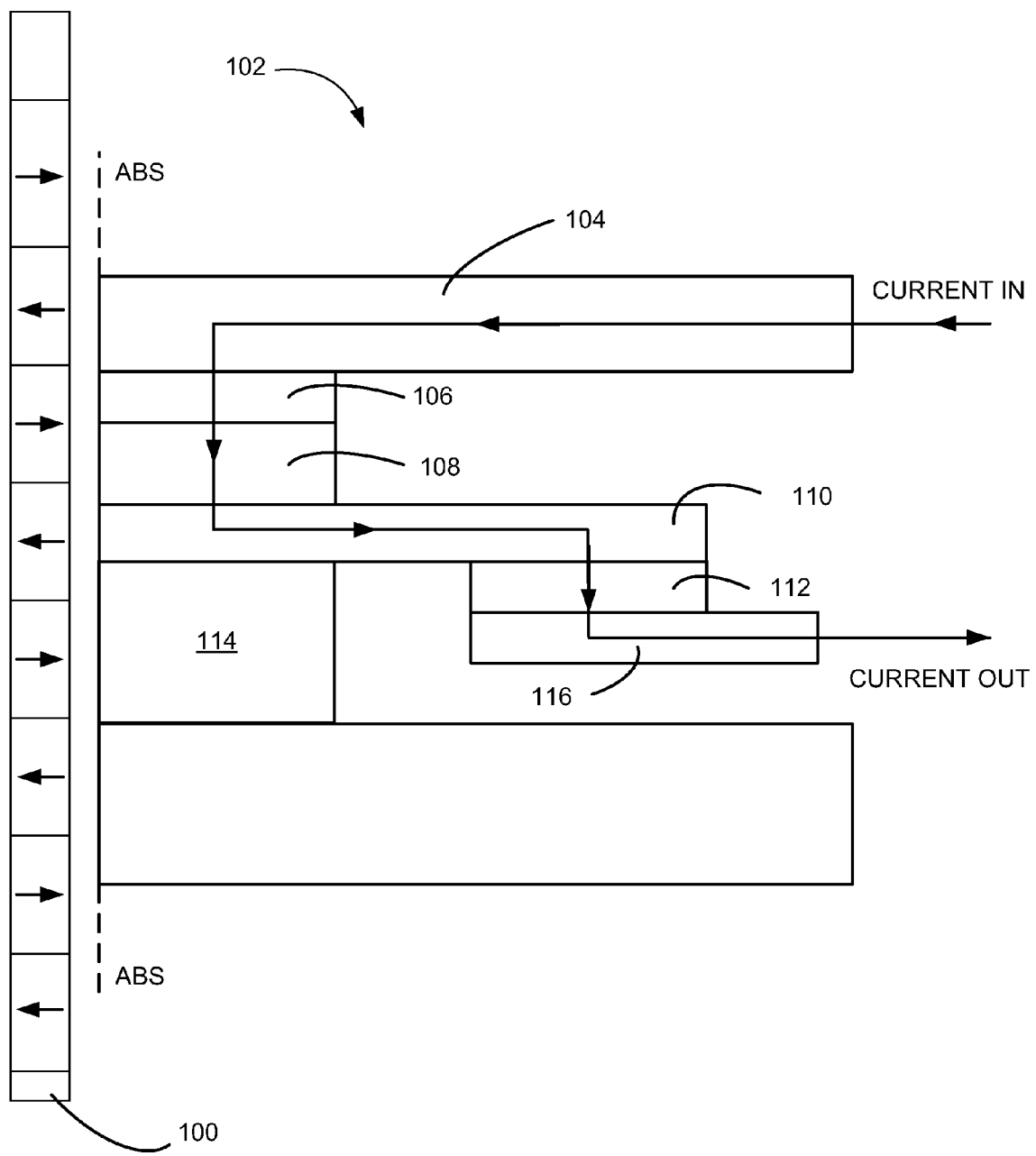
FIG. 1 provides a side view of a reader portion of a magnetic head, in accordance with certain embodiments of the present disclosure.

FIG. 1 shows a recording medium 100 and a reader portion 102 of a magnetic head, the reader 102 includes a top shield 104, cap layer 106, polarizer 108, nonmagnetic layer 110, analyzer 112, bottom shield 114, and bottom lead/electrode 116. Certain spacing and insulating layers of the reader may be omitted for clarity. Further, layers may not be to scale. The cap layer 106, polarizer 108, and nonmagnetic layer 110 are positioned in between the top and bottom shields 104, 114 at an air bearing surface (ABS, noted in dotted lines). The nonmagnetic layer 110 extends a length beyond the cap layer 106 and polarizer 108 from the ABS. The analyzer 112 is positioned adjacent the nonmagnetic layer 110 and at a distance recessed (or spaced from) from the ABS, such that the analyzer 112 does not contribute to the shield-to-shield spacing (i.e., the distance between the top shield 104 and bottom shield 114). The bottom shield 114 is positioned in between the ABS and the analyzer 112. As a result, at a minimum, only the polarizer 108 and nonmagnetic layer 110 contribute to the shield-to-shield spacing because it has been recognized that some cap layer materials can be magnetically considered to be part of the top shield 104.

Current travels into the reader through the top shield 104, polarizer 108, nonmagnetic layer 110, analyzer 112, and out though the bottom lead/electrode 116 (the current path is shown by arrows through the layers). The polarizer 108 is a layer of magnetic material having a free magnetization and may include but is not limited to Heuster alloys and metals and alloys comprising Mn, Co, Fe, Ni, and Cr (e.g., CoFe or NiFe alloys). The polarizer 108 senses a change in the direction of magnetization of the recording medium 100 with the magnetization directions being represented by arrows in the recording medium 100 in FIG. 1. As current flows through the polarizer 108, flowing electrons are polarized as a result of excitation of the polarizer from the recording media 100; thereby creating a signal containing electron spin. The spin signal is carried through the nonmagnetic layer 110, which could be a conductive material like copper. While magnetization excitation of the polarizer 108 by the media 100 only extends about 10 nm into the ABS, electron spins are preserved to lengths up to 100-200 nm in the nonmagnetic layer 110. This preservation of spin permits the analyzer 112 to be recessed from the ABS and still analyze/read data from the recording medium 100. The spin signal is transferred to the analyzer 112, which could be an anti-ferromagnetic biased (pinned) material, a synthetic anti-ferromagnetic material, or a harder magnetic material. The analyzer 112 reads the spin signal, which is then transferred to the bottom lead 116. As such, a low shield-to-shield spacing can be achieved with a read sensor that includes a single polarizing magnetic layer at the ABS, a nonmagnetic conductor to transfer electron spin, and an analyzer spaced from the ABS to read out the signal.

Figure 2:
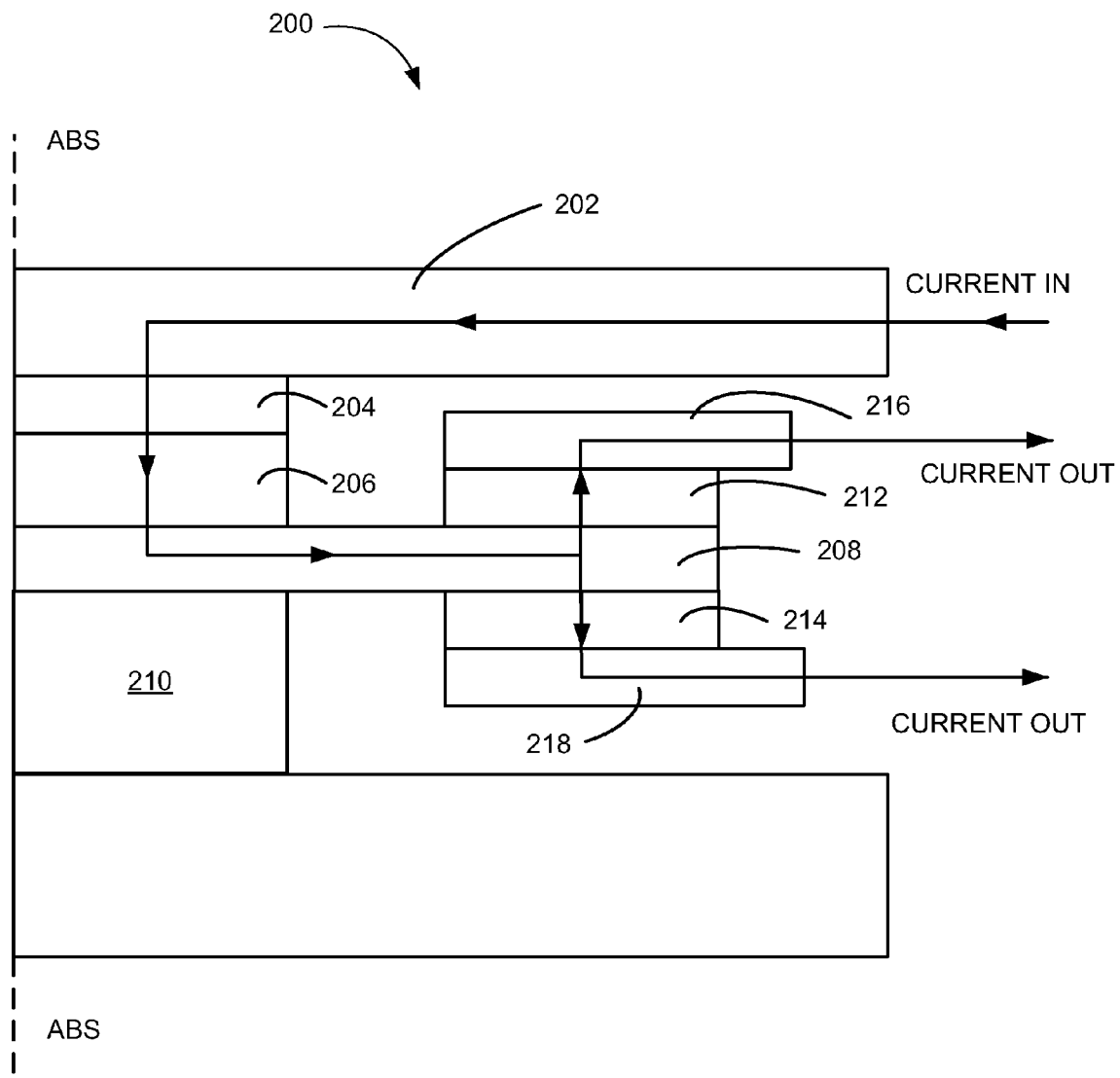
FIG. 2 provides a side view of a reader portion of a magnetic head, in accordance with certain embodiments of the present disclosure.

FIG. 2 shows a reader portion 200 of a magnetic head, the reader 200 includes a top shield 202, cap layer 204, polarizer 206, nonmagnetic layer 208, bottom shield 210, first and second analyzer 212, 214, and first and second bottom lead 216, 218. Certain spacing and insulating layers of the reader may be omitted for clarity. Further, layers may not be to scale. The cap layer 204, polarizer 206, and nonmagnetic layer 208 are positioned in between the top and bottom shields 202, 210 at an air bearing surface (ABS). The nonmagnetic layer 208 extends a length beyond the cap layer 204 and polarizer 206 away from the ABS. The first analyzer 212 is positioned adjacent the nonmagnetic layer 208 and at a distance spaced from the ABS, such that the first analyzer 212 does not contribute to the shield-to-shield spacing. The polarizer 206 is positioned between the first analyzer 212 and the ABS. The second analyzer 214 is likewise positioned adjacent the nonmagnetic layer 208 but on the opposite side of the first analyzer 212. As a result, at a minimum, only the polarizer 206 and nonmagnetic layer 208 may contribute to the shield-to-shield spacing, In this configuration, the polarizer 206 is mated with the first and second analyzers 212, 214 to make a three terminal device.

Current travels into the reader 200 through the top shield 202, cap layer 204, polarizer 206, nonmagnetic layer 208, first and/or second analyzer 212, 214, and out through the first and/or second bottom leads 216, 218. The layers function similarly to the configuration of FIG. 1, but here, when the first and second analyzers 212, 214 have opposite magnetization directions, the analyzers 212, 214 may be used as a differential detector to boost the spin signal. Alternatively, when the first and second analyzers 212, 214 have magnetizations in the same direction, a cross-correlation detector may be used to reduce magnetic noise and optimize a signal-to-noise ratio. The polarizer 206 can be a Heusler alloy, which has high polarization capability; thereby boosting the efficiency of the three terminal device.

Figure 3:
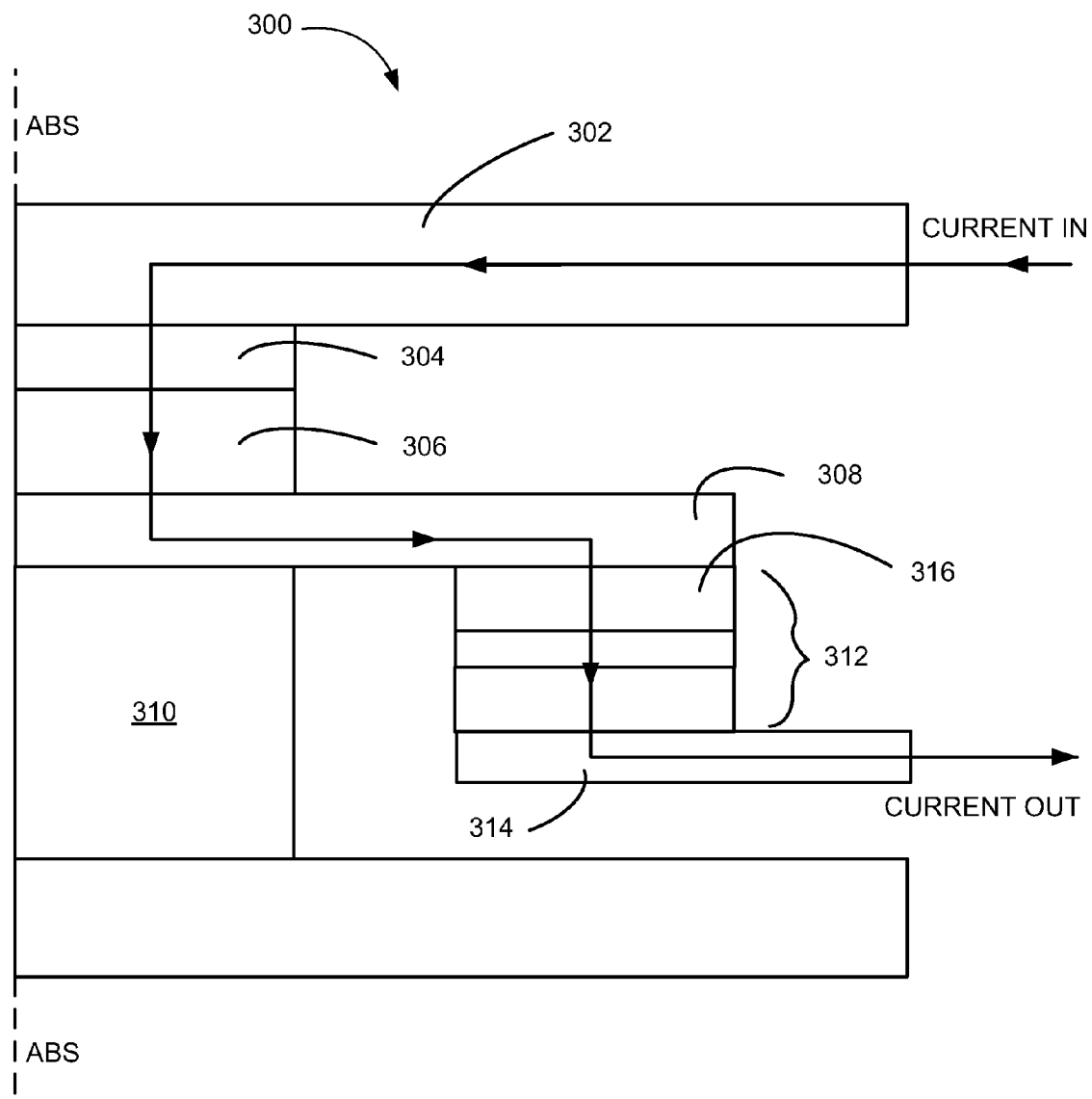
FIG. 3 provides a side view of a reader portion of a magnetic head, in accordance with certain embodiments of the present disclosure.

FIG. 3 shows a reader portion 300 of a magnetic head, the reader 300 including a top shield 302, cap layer 304, polarizer 306, nonmagnetic layer 308, bottom shield 310, sensor stack 312, and bottom lead 314. Certain spacing and insulating layers of the reader may be omitted for clarity. Further, layers may not be to scale. The cap layer 304, polarizer 306, and nonmagnetic layer 308 are positioned in between the top and bottom shields 302, 310 at an air bearing surface (ABS). The nonmagnetic layer 308 extends a length recessed behind the cap layer 304 and polarizer 306. The sensor stack 312 is positioned adjacent the nonmagnetic layer 308 and at a distance recessed from the ABS, such that the sensor stack 310 does not contribute to the shield-to-shield spacing. As a result, at a minimum, only the polarizer 306 and nonmagnetic layer 308 may contribute to the shield-to-shield spacing.

The sensor stack 312 can be, for example, a trilayer reader stack or a current perpendicular-to-place spin valve (CPP-SV) sensor stack. Both types of sensor stacks have a free layer 316 that is positioned adjacent the nonmagnetic layer 308, Current travels through the top shield 302, cap layer 304, polarizer 306, nonmagnetic layer 308, sensor stack 310, and bottom lead 314.

As opposed to the configurations in FIGS. 1 and 2, the polarizer 306 is mated with a full reader stack 312 recessed behind or spaced from the ABS such that the bottom shield 210 is positioned between the ABS and the sensor stack 312. Using high currents ($>1 \times 10^7$ A/cm$^2$) the spin momentum transfer (SMT) effect is used to make the magnetization of the recessed free layer 316 follow that in the polarizer 306. The free layer 316 and polarizer 306 magnetizations are initially in the same direction, and the SMT effect is such that a torque is exerted on the free layer 316 magnetization to make it follow the polarizer 306.

Figure 4:
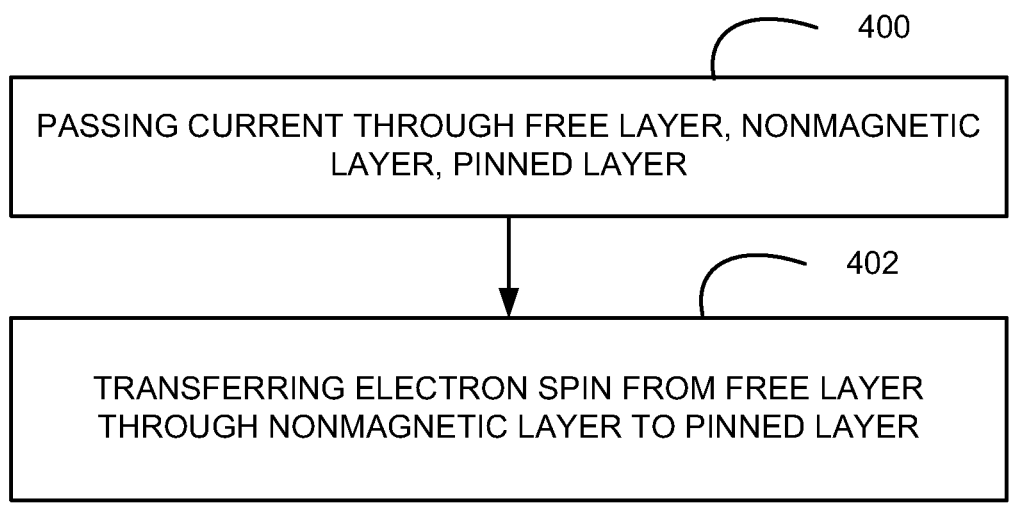
FIG. 4 provides a process carried out in accordance with certain embodiments of the present disclosure.

FIG. 4 provides a process carried out in accordance with certain embodiments of the present disclosure. Block 400 includes passing current through a polarizer, nonmagnetic layer, and analyzer. Block 402 includes transferring an electron spin from the polarizer through the nonmagnetic layer to the analyzer. For configurations similar to that of FIG. 3, current is passed through a polarizer layer, nonmagnetic layer, and a sensor stack that includes a free layer.

It is to be understood that even though numerous characteristics and advantages of various embodiments of the present invention have been set forth in the foregoing description, together with details of the structure and function of various embodiments of the invention, this detailed description is illustrative only, and changes may be made in detail, especially in matters of structure and arrangements of parts within the principles of the present invention to the full extent indicated by the broad general meaning of the terms in which the appended claims are expressed. For example, the structures disclosed need not be limited to magnetic head read sensors, but could be implemented in a variety of applications that likewise use tunneling magnetoresistive and spin valve elements.

What is claimed is:

1. An apparatus comprising:
   a top shield and a bottom shield both positioned at a first plane;
   a polarizer and a nonmagnetic conductor layer both positioned at the first plane between the top and bottom shields; and
   a sensor stack having a first sensor layer and positioned at a distance recessed from the first plane,
      wherein the nonmagnetic conductor layer is positioned between the polarizer and the first sensor layer,
      wherein a magnetization of the first sensor layer is arranged and configured to move in the same direction as a magnetization of the polarizer.

2. The apparatus of claim 1, wherein the distance is 200 nm or less.

3. The apparatus of claim 1, further comprising:
   a cap layer positioned between the top and bottom shields.

4. The apparatus of claim 1, further comprising:
   a current path through the top shield, polarizer, nonmagnetic conductor layer, first sensor layer, and remaining portion of the sensor stack.

5. The apparatus of claim 1, wherein the magnetization of the first sensor layer changes in response to a spin momentum transfer of polarized electrons from the polarizer.

6. The apparatus of claim 5, wherein an electron spin from the polarizer is passed through the nonmagnetic layer to the first sensor layer.

7. The apparatus of claim 1, wherein the sensor stack is a current perpendicular-to-plane (CPP) stack.

8. The apparatus of claim 1, wherein the sensor stack is a tunneling-magneto resistive (TMR) stack.

9. The apparatus of claim 1, wherein an shield-to-shield spacing is less than 10 nm.

10. A method comprising:
    passing current through a polarizer, nonmagnetic conductor layer, and first sensor layer; both the polarizer and the nonmagnetic conductor layer are positioned at a first plane and the first sensor layer is recessed a distance from the first plane; and
    transferring an electron spin from the polarizer through the nonmagnetic layer to the first sensor layer such that a magnetization of the first sensor layer moves in the same direction as a magnetization of the polarizer.

11. The method of claim 10, wherein the distance is at one of or between 100 and 200 nm.

12. The method of claim 10, further comprising:
    changing a direction of the magnetization of the polarizer by sensing a direction of magnetization of a recording medium.

* * * * *